US009882387B2

(12) United States Patent
Choi

(10) Patent No.: US 9,882,387 B2
(45) Date of Patent: Jan. 30, 2018

(54) REACTIVE POWER COMPENSATION SYSTEM AND METHOD THEREOF

(71) Applicant: LSIS CO., LTD., Gyeonggi-do (KR)

(72) Inventor: Yong-Kil Choi, Gyeonggi-do (KR)

(73) Assignee: LSIS Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/600,818

(22) Filed: May 22, 2017

(65) Prior Publication Data
US 2017/0346287 A1    Nov. 30, 2017

(30) Foreign Application Priority Data

May 31, 2016  (KR) .......................... 10-2016-0067101

(51) Int. Cl.
| | | |
|---|---|---|
| *G05F 1/70* | (2006.01) | |
| *H02J 3/18* | (2006.01) | |
| *H02J 3/01* | (2006.01) | |
| *H02J 3/26* | (2006.01) | |
| *H02J 3/16* | (2006.01) | |
| *H03K 17/72* | (2006.01) | |

(52) U.S. Cl.
CPC .............. *H02J 3/1821* (2013.01); *H02J 3/01* (2013.01); *H02J 3/16* (2013.01); *H02J 3/26* (2013.01); *H03K 17/72* (2013.01)

(58) Field of Classification Search
CPC ........................................................ G05F 1/70
USPC ........................ 323/205, 208, 209, 210, 211
See application file for complete search history.

(56) References Cited

U.S. PATENT DOCUMENTS

| | | | |
|---|---|---|---|
| 3,936,727 A | 2/1976 | Kelley et al. | |
| 5,099,190 A * | 3/1992 | Sato ...................... | H02J 3/1864 323/210 |
| 5,617,447 A | 4/1997 | Tambe | |
| 2008/0157728 A1* | 7/2008 | Toki ...................... | H02J 3/1864 323/210 |
| 2009/0001942 A1* | 1/2009 | Temma .................... | G05F 1/70 323/211 |

(Continued)

FOREIGN PATENT DOCUMENTS

| | | |
|---|---|---|
| CN | 112750 C | 6/2003 |
| EP | 0704953 | 4/1996 |

(Continued)

OTHER PUBLICATIONS

European Search Report for Application No. 17171564.2-1804 dated Oct. 5, 2017—7 pages.

*Primary Examiner* — Jeffrey Sterrett
(74) *Attorney, Agent, or Firm* — K&L Gates LLP

(57) ABSTRACT

The present disclosure relates to a reactive power compensation system includes a first measurement unit, a second measurement unit, a reactive power compensation unit, and a controller. The first measurement unit measures impedance of each of at least one load. The second measurement unit measures a voltage and current provided to the at least one load. The reactive power compensation unit compensates the leading reactive power or the lagging reactive power. The controller monitors a change of the impedance in real time, checks a change of the voltage or current according to the change of the impedance, and controls the reactive power compensation unit according to a result of the check to compensate the leading reactive power or the lagging reactive power.

9 Claims, 2 Drawing Sheets

(56) References Cited

U.S. PATENT DOCUMENTS

| | | | |
|---|---|---|---|
| 2009/0184694 A1* | 7/2009 | Matsuda | H02J 3/1871 323/208 |
| 2012/0139506 A1* | 6/2012 | Matsuda | H02J 3/1828 323/210 |
| 2012/0280673 A1 | 11/2012 | Watanabe et al. | |
| 2013/0134779 A1 | 5/2013 | Watanabe et al. | |
| 2015/0054473 A1 | 2/2015 | Matsuda et al. | |
| 2017/0344046 * | 11/2017 | Choi | G05F 1/70 |
| 2017/0346287 * | 11/2017 | Choi | H02J 3/1821 |

FOREIGN PATENT DOCUMENTS

| | | |
|---|---|---|
| JP | 2010-279115 A | 12/2010 |
| JP | 2011-35951 A | 2/2011 |
| JP | 5862955 B2 | 2/2016 |
| KR | 10-2004-0004849 A | 1/2004 |
| WO | 2016/110254 A1 | 7/2016 |

* cited by examiner

REACTIVE POWER COMPENSATION SYSTEM AND METHOD THEREOF

CROSS-REFERENCE TO RELATED APPLICATIONS

This application claims the priority of Korean Patent Application No. 10-2016-0067101 filed on May 31, 2016, in the Korean Intellectual Property Office, the disclosure of which is hereby incorporated by reference in its entirety.

BACKGROUND

1. Technical Field

The present disclosure relates to a reactive power compensation system and a method thereof.

2. Description of the Related Art

When power is supplied to a receiving end connected to a load, the power is not all used by the load. In other words, the power is not all used as active power by the load and part of the power is lost as reactive power, not contributing to a real work.

To minimize or compensate the reactive power, a reactive power compensation system is employed.

The reactive power compensation system adjusts a phase of a voltage or a phase of current and thus the reactive power may be minimized.

However, in a conventional reactive power compensation system, since real-time compensation according to a load input state or an environmental change is not made, manufactured products may be damaged, for example, due to a temporary blackout state caused by a rapid voltage drop.

SUMMARY

It is an object of the present disclosure to address the above-described problems and other problems.

It is another object of the present disclosure to provide a reactive power compensation system, which is capable of compensating reactive power in real time by continuously monitoring a change in the impedance of a load, and a method thereof.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

In accordance with one aspect of the present disclosure, there is provided a reactive power compensation system including a first measurement unit, a second measurement unit, a reactive power compensation unit, and a controller. The first measurement unit measures impedance of each of at least one load. The second measurement unit measures a voltage and current provided to the at least one load. The reactive power compensation unit compensates the leading reactive power or the lagging reactive power. The controller monitors a change of the impedance in real time, checks a change of the voltage or current according to the change of the impedance, and controls the reactive power compensation unit according to a result of the check to compensate the leading reactive power or the lagging reactive power.

In accordance with one aspect of the present disclosure, there is provided a method of compensating reactive power, which includes measuring impedance of each of at least one load, measuring a voltage and current provided to the at least one load, monitoring a change of the impedance in real time, checking a change of the voltage or current according to the change of the impedance, and compensating leading reactive power or lagging reactive power according to a result of the check.

DETAILED DESCRIPTION

Figure 1:
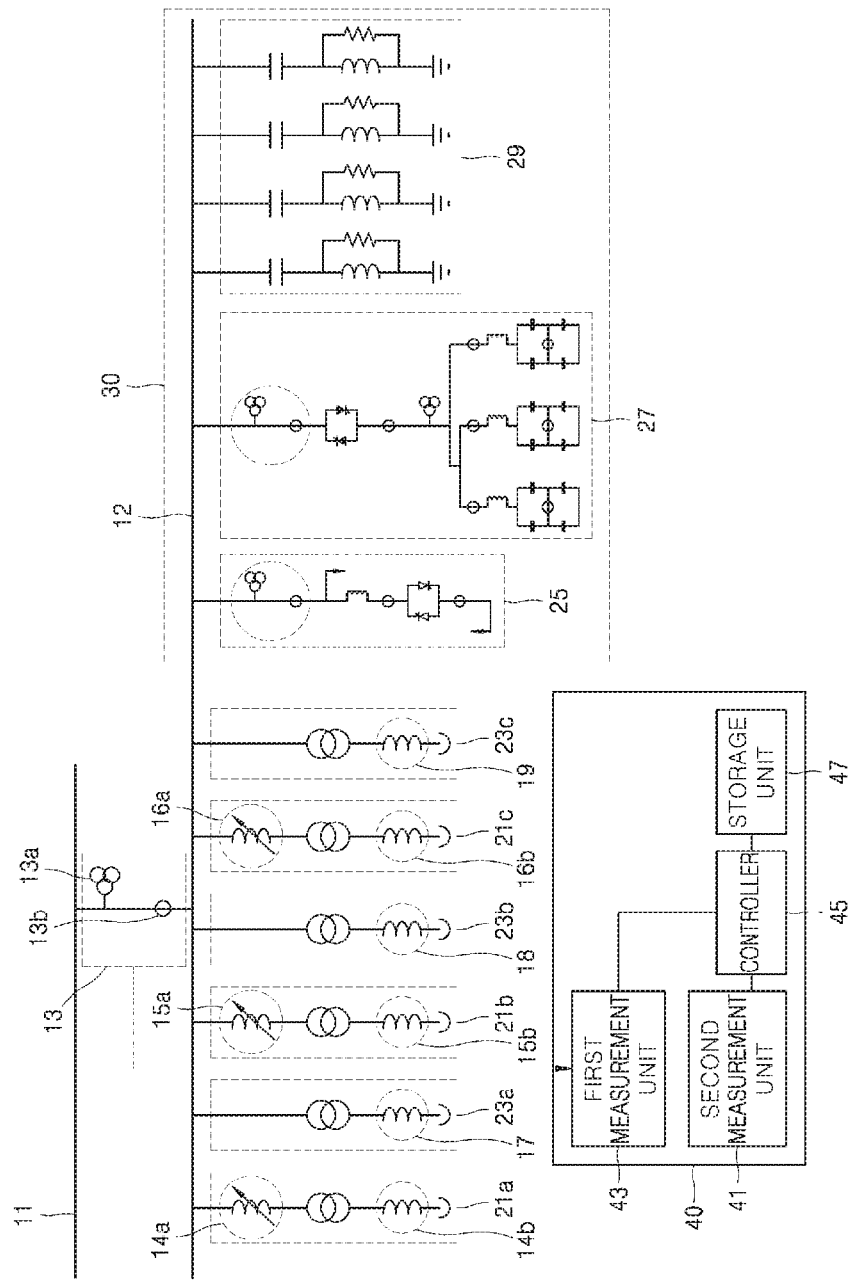
FIG. 1 illustrates a reactive power compensation system according to an embodiment of the present disclosure.

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well-known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

As the inventive concept allows for various changes and numerous embodiments, particular embodiments will be illustrated in the drawings and described in detail in the written description, wherein like reference numerals in the drawings denote like elements, and thus their description will not be repeated. The suffix "module" and "unit" for components, which are used in the description below, are assigned and mixed in consideration of only the easiness in writing the specification. That is, the suffix itself does not have different meanings or roles. However, this is not intended to limit the present inventive concept to particular modes of practice, and it is to be appreciated that all changes, equivalents, and substitutes that do not depart from the spirit and technical scope of the present inventive concept are encompassed in the present inventive concept. In the description of the present inventive concept, certain detailed explanations of related art are omitted when it is deemed that they may unnecessarily obscure the essence of the inventive concept.

FIG. 1 illustrates a reactive power compensation system according to an embodiment of the present disclosure.

A plurality of loads 21a, 21b, 21c, 23a, 23b, and 23c may be connected to a receiving end 11. In detail, a branch line 12 may be branched from the receiving end 11, and the loads 21a, 21b, 21c, 23a, 23b, and 23c may be connected to the branch line 12.

Although FIG. 1 illustrates that the branch line 12 is connected to the receiving end 11, the loads 21a, 21b, 21c, 23a, 23b, and 23c may be directly connected to the receiving end 11 without the branch line 12.

The loads 21a, 21b, 21c, 23a, 23b, and 23c may be connected to a system other than the receiving end 11. The system may be an AC system, a DC system, or a HVDC system. However, the present disclosure is not limited thereto.

The loads 21a, 21b, 21c, 23a, 23b, and 23c may be loads provided in ironworks, for example, arc furnaces 21a, 21b, and 21c or smelting furnaces 23a, 23b, and 23c. However, the present disclosure is not limited thereto.

A reactive power compensation unit 30 may be connected parallel to the loads 21a, 21b, 21c, 23a, 23b, and 23c and commonly with the loads 21a, 21b, 21c, 23a, 23b, and 23c to the branch line 12 or the receiving end 11, but the present disclosure is not limited thereto. Accordingly, power supplied to the receiving end 11 may be supplied not only to the loads 21a, 21b, 21c, 23a, 23b, and 23c, but also to the reactive power compensation unit 30.

Figure 2:
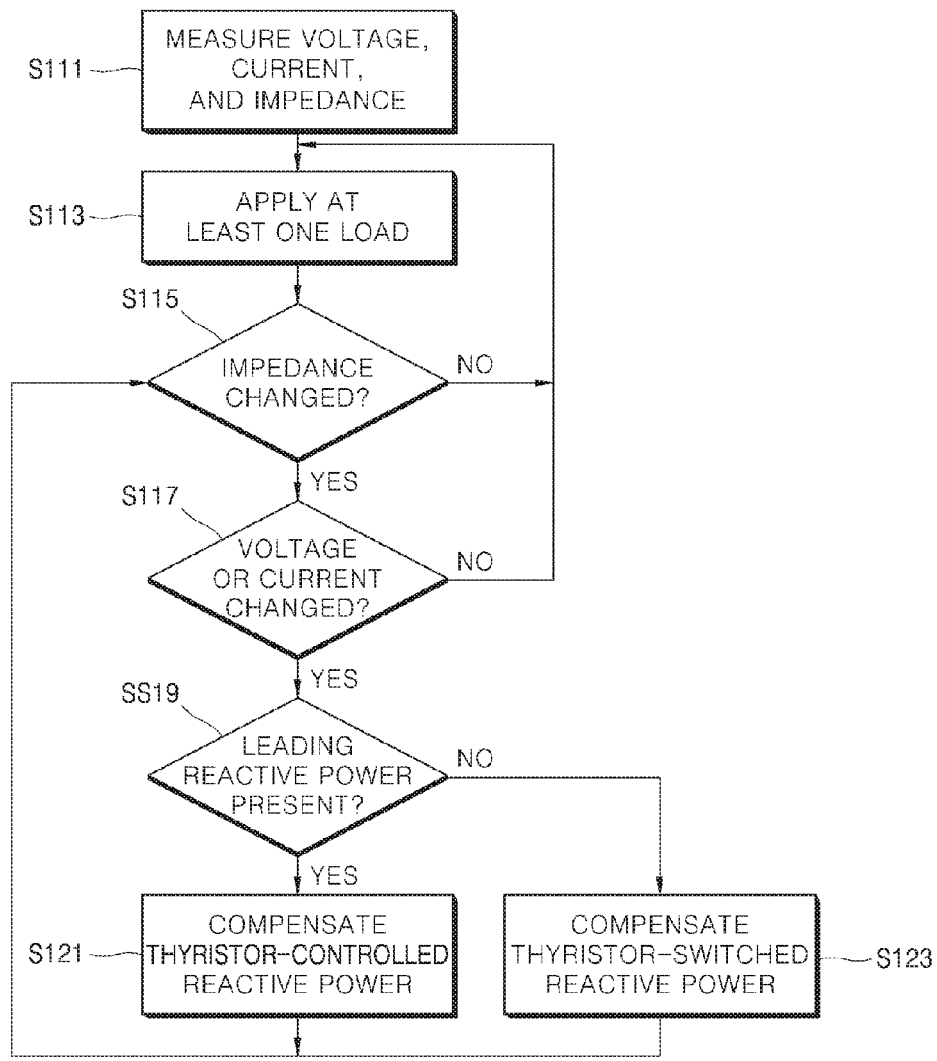
FIG. 2 is a flowchart of a method of compensating reactive power according to an embodiment of the present disclosure.

The reactive power compensation unit 30, as illustrated in FIG. 2, may include a Thyristor-controlled reactor (TCR) 25, a Thyristor-switched capacitor (TSC) 27, and a harmonic filter unit 29.

The TCR 25 may include a reactor and a thyristor switch. The number or arrangement of reactors may be implemented by various methods.

The TSC 27 may include a capacitor and a thyristor switch. The number or arrangement of capacitors may be implemented by various methods.

The harmonic filter unit 29 may include a plurality of filters. Each filter may include a resistor, a capacitor, and an inductor. Although the resistor and the inductor may be connected in parallel, but the present disclosure is not limited thereto.

Both the TCR 25 and the TSC 27 may not be necessarily provided. Only one of the TCR 25 and the TSC 27 may be provided, but the present disclosure is not limited thereto.

Although not illustrated, a fixed compensation unit may be further provided in addition to the TCR 25 or the TSC 27. The fixed compensation unit may be a fixed capacitor.

The reactive power compensation unit 30 may control a Thyristor switch provided therein to compensate reactive power The reactive power compensation is described below in detail.

A second detector 13 may be provided between the receiving end 11 and the branch line 12. In other words, the second detector 13 may be provided at an input side of the loads 21a, 21b, 21c, 23a, 23b, and 23c. The second detector 13 may detect a voltage, a phase of a voltage, current, and a phase of current. In detail, a voltage transformer 13a of the second detection unit 13 may detect the voltage and the phase of a voltage applied to the branch line 12, and a current transformer 13b of the second detection unit 13 may detect the current and the phase of current applied to the branch line 12. The voltage and the phase of a voltage, and the current and the phase of current, detected by the second detection unit 13 are provided to a voltage and current measurement unit 43. Accordingly, the voltage and current measurement unit 43 may measure voltage and current.

A phase relation between the voltage and the current may be identified based on the phase of a voltage and the phase of current. For example, when a phase of current is ahead of a phase of a voltage, it may be referred to as leading, and when a phase of a voltage is ahead of a phase of current, it may be referred to as lagging. For example, when a phase angle between the voltage and the current in the leading, is expressed by a positive phase angle ($\pm\theta$), a phase angle between the voltage and the current in the lagging may be expressed by a negative phase angle ($-\theta$).

At least one of first detectors 14a, 14b, 15a, 15b, 16a, 16b, 17, 18, and 19 may be provided at the loads 21a, 21b, 21c, 23a, 23b, and 23c. The first detectors 14a, 14b, 15a, 15b, 16a, 16b, 17, 18, and 19 detect impedance of the loads 21a, 21b, 21c, 23a, 23b, and 23c and provide the detected impedance to an impedance measurement unit 41 of the control system 40. Accordingly, the impedance measurement unit 41 may measure impedance of each of the loads 21a, 21b, 21c, 23a, 23b, and 23c.

When a certain load is input or a change occurs in an operating load, impedance of the load may be changed. The change in the impedance of the load may be detected by a corresponding one of the first detectors 14a, 14b, 15a, 15b, 16a, 16b, 17, 18, and 19 and checked by the impedance measurement unit 41. The impedance measurement unit 41 may be referred to as the first measurement unit, and the voltage and current measurement unit 43 may be referred to as the second measurement unit.

A voltage may be simultaneously applied to the loads 21a, 21b, 21c, 23a, 23b, and 23c, and individually to the loads 21a, 21b, 21c, 23a, 23b, and 23c at different times.

The control system 40 may include the first measurement unit 41, the second measurement unit 43, a controller 45, and a storage unit 47.

The first measurement unit 41 may measure the impedance of each of the loads 21a, 21b, 21c, 23a, 23b, and 23c detected by the first detectors 14a, 14b, 15a, 15b, 16a, 16b, 17, 18, and 19 provided at the respective loads 21a, 21b, 21c, 23a, 23b, and 23c. While the impedance detected by the first detectors 14a, 14b, 15a, 15b, 16a, 16b, 17, 18, and 19 is an analog signal, the impedance measured by the first measurement unit 41 may be a digital signal. However, the present disclosure is not limited thereto. The impedance measured by the first measurement unit 41 may be provided to the controller 45.

The second measurement unit 43 may measure the voltage and the current based on the voltage, the phase of a voltage, the current, and the phase of current detected by the second detector 13 provided between the receiving end 11 and the branch line 12. The voltage may be the voltage applied to the loads 21a, 21b, 21c, 23a, 23b, and 23c, and the current may be the current flowing from the receiving end 11 to the branch line 12. While each of the voltage, the phase of a voltage, the current, and the phase of current detected by the second detector 13 is an analog signal, the voltage and the current measured by the second measurement unit 43 may be digital signals, but the present disclosure is not limited thereto. The measured voltage and current may be provided to the controller 45.

The controller 45 may check whether the impedance measured by the first measurement unit 41 has changed. The change of the impedance may be checked in real time.

For example, when the impedance measured at a time point t1 is Z1 and the impedance measured at a time point t2 is Z2, and Z2 is different from Z1, it may be determined that the impedance has changed.

The change of the impedance may be checked for each of the loads 21a, 21b, 21c, 23a, 23b, and 23c, and through the total impedance of the loads 21a, 21b, 21c, 23a, 23b, and 23c.

In the present embodiment, for convenience of explanation, the change of the impedance is checked through the total impedance of the loads 21a, 21b, 21c, 23a, 23b, and 23c, but the present disclosure is not limited thereto.

The change of impedance may signify that a load to which a voltage is applied is changed, an abrupt change, for example, incoming of overcurrent, occurs in the load to which a voltage is currently applied.

For example, in a state in which a voltage is applied to five loads, when a voltage is additionally applied to two loads, impedance may be changed.

For example, in a state in which a voltage is applied to five loads, when current abruptly flows to a particular load, impedance may be changed.

When the impedance is changed, it is necessary to identify the reason of the change of impedance. For example, when a voltage is initially applied to a load or a voltage is applied to a newly added load, it is necessary to identify whether the load to which a voltage is initially applied or the load to which a voltage is additionally applied is a Thyristor-switched load or a Thyristor-controlled load. Performing either leading reactive power compensation or lagging reactive power compensation may be determined according to whether the load is a Thyristor-switched load or a Thyristor-controlled load. For example, when the load is a Thyristor-switched load, leading reactive power compensation may be performed, and when the load is a Thyristor-controlled load, lagging reactive power compensation may be performed, which is described later in detail.

The voltage or current of power provide from the receiving end 11 to the branch line 12 may vary according to whether the load to which a voltage is initially applied or the load to which a voltage is additionally applied is a Thyristor-switched load or a Thyristor-controlled load.

In other words, when the impedance is changed, the voltage or current of the power provided from the receiving end 11 to the branch line 12 is changed accordingly.

The controller 45 may check whether there is a change in the voltage or current detected by the second detector 13 provided between the receiving end 11 and the branch line 12 and measured by the second measurement unit 43.

When it is checked that the current is changed and thus the phase of current is ahead of the phase of a voltage, that is, the leading, the controller 45 may determine that the load causing the change of the impedance is a Thyristor-switched load. Since the leading reactive power is present or increased by the Thyristor-switched load, the leading reactive power may be removed or reduced by compensating the leading reactive power. In this case, the controller 45 may generate a first control signal to compensate the leading reactive power and provide the first control signal to the reactive power compensation unit 30.

Although the first control signal may be, for example, a signal controlling the phase of current to be synchronized with the phase of a voltage, the present disclosure is not limited thereto. The leading reactive power may be compensated as a Thyristor switch of the TCR 25 included in the reactive power compensation unit 30 is switch-controlled in response to the first control signal. As such, when the impedance is changed by the Thyristor-switched load, the leading reactive power is compensated by means of the TCR 25. Accordingly, the power factor may be improved, that is, the active power may be increased, as the phase angle of the current and the voltage becomes 0° or approaches 0°.

When it is checked that the voltage is changed and thus the phase of a voltage is ahead of the phase of current, that is, the lagging, the controller 45 may determine that the load causing the change of the impedance is a Thyristor-controlled load. Since lagging reactive power is present or increased by the Thyristor-controlled load, the lagging reactive power may be removed or reduced by compensating the lagging reactive power. In this case, the controller 45 may generate a second control signal to compensate the lagging reactive power and provide the second control signal to the reactive power compensation unit 30.

Although the second control signal may be, for example, a signal controlling the phase of a voltage to be synchronized with the phase of current, the present disclosure is not limited thereto. The lagging reactive power may be compensated as a Thyristor switch of the TSC 27 included in the reactive power compensation unit 30 is switch-controlled in response to the second control signal. As such, when the impedance is changed by the Thyristor-controlled load, the lagging reactive power is compensated by means of the TSC 27. Accordingly, the power factor may be improved, that is, the active power may be increased, as the phase angle of the current and the voltage becomes 0° or approaches 0°.

According to the present disclosure, when a change occurs in the impedance of a load impedance by monitoring the impedance change in real time, whether the load is a Thyristor-switched load or a Thyristor-controlled load is identified based on the change in the voltage or current according to the change of impedance and thus compensation is performed accordingly. Thus, the damage of a product due to the addition of a load or overcurrent flowing to the load may be prevented. For example, when the load is a refining furnace, and a flicker is generated due to a change of the load causing a temporary blackout, impurities in iron may not be appropriately removed and thus defective iron may be produced. In this case, when the load is determined to be a Thyristor-switched load based on the change of impedance, a flicker is regarded to be generated. When a flicker is generated, the leading reactive power in which the phase of current is ahead of the phase of a voltage may increase. Accordingly, the controller 45 may control the TSC 27 to compensate the leading reactive power, thereby removing the flicker.

The storage unit 47 may store various pieces of setting information, for example the type of work or the amount of work processed by each of the loads 21a, 21b, 21c, 23a, 23b, and 23c.

The storage unit 47 may store a work temperature sensed at a place where the loads 21a, 21b, 21c, 23a, 23b, and 23c are provided.

The storage unit 47 may store various pieces of information needed to embody the present disclosure that is not described above.

FIG. 2 is a flowchart of a method of compensating reactive power according to an embodiment of the present disclosure.

Referring to FIGS. 1 and 2, a voltage, current, and impedance may be measured (S111).

In detail, the impedance may be measured by the first measurement unit 41, and the voltage and current may be measured by the second measurement unit 43. The impedance may be measured from signals detected by the first detectors 14a, 14b, 15a, 15b, 16a, 16b, 17, 18, and 19 provided at the respective loads 21a, 21b, 21c, 23a, 23b, and 23c. The voltage and current may be measured from a signal detected by the second detector 13 provided between the receiving end 11 and the branch line 12.

The second detector 13 may detect the voltage, the phase of a voltage, the current, and the phase of current. The second measurement unit 43 may check whether the leading reactive power is present or the lagging reactive power is present, based on the relation between the phase of a voltage and the phase of current. In addition, the second measurement unit 43 may calculate a phase angle based on the relation between the phase of a voltage and the phase of current. The second measurement unit 43 may provide the controller 45 with the measured voltage and current, information about the leading reactive power or the lagging reactive power, and the phase of angle.

A voltage may be applied to at least one of the loads 21a, 21b, 21c, 23a, 23b, and 23c (S113). The at least one of the loads 21a, 21b, 21c, 23a, 23b, and 23c may be a load to which a voltage is initially applied or a load to which a voltage is newly applied while a voltage is applied to other load(s).

The controller 45 may check whether impedance is changed while a voltage is applied to the at least one of the loads 21a, 21b, 21c, 23a, 23b, and 23c (S115).

The change of impedance may be changed based on the impedance detected in real time by the first detectors 14a, 14b, 15a, 15b, 16a, 16b, 17, 18, and 19 and measured by the first measurement unit 41.

When the impedance change is checked, the controller 45 may check whether a voltage or current is changed (S117).

The change of a voltage or current may be checked based on the voltage, current and phase angle detected in real time by the second detector 13 and measured by the second measurement unit 43.

The impedance may be changed due to the newly added load or the load into which current abruptly flows. When the impedance is changed, the voltage or current may be changed according to whether the load is a Thyristor-switched load or a Thyristor-controlled load.

For example, when the load is a Thyristor-switched load, for example, current changed and thus the leading reactive power in which the phase of current is ahead of the phase of a voltage may be present. Unlike the above, when the load is a Thyristor-switched load, for example, a voltage is changed and thus the leading reactive power in which the phase of a voltage is behind the phase of current may be present.

For example, when the load is a Thyristor-controlled load, for example, a voltage is changed and thus the lagging reactive power in which the phase of a voltage is ahead of the phase of current may be present. Unlike the above, when the load is a Thyristor-controlled load, for example, current is changed and thus the lagging reactive power in which the phase of current is behind the phase of a voltage may be present.

The controller 45 may determine whether the leading reactive power is present or the lagging reactive power is present, based on the change of the current or voltage.

As a result of the determination, when the leading reactive power is present (S119), the controller 45 may control compensation of the Thyristor-controlled reactive power (S121).

In detail, when the leading reactive power is present, the controller 45 may generate a first control signal to compensate the leading reactive power and provide the first control signal to the reactive power compensation unit 30. The first control signal may be a signal to adjust, for example, the phase of current, to be synchronized with the phase of a voltage, but the present disclosure is not limited thereto. As the Thyristor switch of the TCR25 included in the reactive power compensation unit 30 is switch-controlled in response to the first control signal, the leading reactive power may be compensated.

As a result of the determination, when the lagging reactive power is present, the controller 45 may control compensation of the Thyristor-switched reactive power (S123).

In detail, when the lagging reactive power is present, the controller 45 may generate a second control signal to compensate the lagging reactive power and provide the second control signal to the reactive power compensation unit 30. Although the second control signal may be a signal to adjust, for example, the phase of a voltage, to be synchronized with the phase of current, the present disclosure is not limited thereto. As the Thyristor switch of the TSC 27 included in the reactive power compensation unit 30 is switch-controlled in response to the second control signal, the lagging reactive power may be compensated.

As such, according to the present disclosure, whenever the impedance is changed, compensation may be performed according to the change of the impedance.

According to the present disclosure, by monitoring a change of impedance in real time, the leading reactive power or the lagging reactive power that is present according to whether the load causing the impedance change is a Thyristor-switched load or a Thyristor-controlled load may be identified based on the change in the voltage or current. Since the leading reactive power or the lagging reactive power is compensated in real time according to a result of the identification, the damage of a product due to a change of the load may be prevented.

The present disclosure described above may be variously substituted, altered, and modified by those skilled in the art to which the present inventive concept pertains without departing from the scope and sprit of the present disclosure. Therefore, the present disclosure is not limited to the above-mentioned exemplary embodiments and the accompanying drawings.

What is claimed is:

1. A reactive power compensation system which compensates leading reactive power or lagging reactive power, the system comprising:
   a first measurement unit configured to measure impedance of each of at least one load;
   a second measurement unit configured to measure a voltage and current provided to the at least one load;
   a reactive power compensation unit configured to compensate the leading reactive power or the lagging reactive power; and
   a controller configured to monitor a change of the impedance in real time, check a change of the voltage or current according to the change of the impedance, and control the reactive power compensation unit according to a result of the check to compensate the leading reactive power or the lagging reactive power,
   wherein the controller determines based on the change of the voltage or current whether a specific load causing the change of the impedance is a Thyristor-switched load or a Thyristor-controlled load.

2. The reactive power compensation system of claim 1, wherein the reactive power compensation unit comprises:
   a Thyristor-controlled compensation unit that compensates the leading reactive power; and
   a Thyristor-switched compensation unit that compensates the lagging reactive power.

3. The reactive power compensation system of claim 2, wherein the controller determines that the specific load is a Thyristor-switched load when a phase of current is ahead of a phase of a voltage, and generates a first control signal to compensate the leading reactive power and provides the first control signal to the Thyristor-controlled compensation unit.

4. The reactive power compensation system of claim 3, wherein the first control signal is a signal to adjust the phase of current to be synchronized with the phase of a voltage.

5. The reactive power compensation system of claim 2, wherein the controller determines that the specific load is a Thyristor-controlled load when a phase of a voltage is ahead of a phase of current, and generates a second control signal to compensate the lagging reactive power and provides the second control signal to the Thyristor-switched compensation unit.

6. The reactive power compensation system of claim 5, wherein the second control signal is a signal to adjust the phase of a voltage to be synchronized with the phase of current.

7. A method of compensating reactive power, the method comprising:
   measuring impedance of each of at least one load;
   measuring a voltage and current provided to the at least one load;
   monitoring a change of the impedance in real time;
   checking a change of the voltage or current according to the change of the impedance; and
   compensating leading reactive power or lagging reactive power according to a result of the check,
   wherein the checking of the change of the voltage or current comprises determining based on the change of the voltage or current whether a specific load causing the change of the impedance is a Thyristor-switched load or a Thyristor-controlled load.

8. The method of claim 7, further comprising:
   determining that the specific load is a Thyristor-switched load when a phase of current is ahead of a phase of a voltage; and
   generating a first control to compensate the leading reactive power.

9. The method of claim 7, further comprising:
   determining that the specific load is a Thyristor-controlled load when a phase of a voltage is ahead of a phase of current; and
   generating a second control signal to compensate the lagging reactive power.

* * * * *